(12) United States Patent
Quadrelli

(10) Patent No.: US 8,875,982 B2
(45) Date of Patent: Nov. 4, 2014

(54) CONTAINER FOR PIECE GOODS

(75) Inventor: Sandro Quadrelli, Bologna (IT)

(73) Assignee: Nestec S.A., Vevey (CH)

( * ) Notice: Subject to any disclaimer, the term of this patent is extended or adjusted under 35 U.S.C. 154(b) by 2395 days.

(21) Appl. No.: 10/556,855

(22) PCT Filed: May 13, 2004

(86) PCT No.: PCT/IB2004/001537
§ 371 (c)(1),
(2), (4) Date: Nov. 20, 2006

(87) PCT Pub. No.: WO2004/101375
PCT Pub. Date: Nov. 25, 2004

(65) Prior Publication Data
US 2008/0128478 A1 Jun. 5, 2008

(30) Foreign Application Priority Data
May 14, 2003 (IT) .............................. BO2003A0295

(51) Int. Cl.
*B65D 5/66* (2006.01)
*B65D 5/02* (2006.01)
*B65D 85/00* (2006.01)
*B65D 5/72* (2006.01)
*B65D 85/60* (2006.01)

(52) U.S. Cl.
CPC ....... *B65D 85/60* (2013.01); *H01L 2924/01005* (2013.01); *B65D 5/029* (2013.01); *B65D 5/6608* (2013.01)
USPC ............ 229/110; 426/115; 206/526; 229/141

(58) Field of Classification Search
CPC ...... B65D 5/3621; B65D 5/02; B65D 5/0254; B65D 5/06; B65D 5/12; B65D 5/3614; B65D 5/6602; B65D 5/701
USPC ......... 229/110, 115, 141, 125.26, 131.1, 153; 426/115; 206/526
See application file for complete search history.

(56) References Cited

U.S. PATENT DOCUMENTS

| 2,000,210 A | * | 5/1935 | Bayless ......................... 229/110 |
| 2,163,017 A | * | 6/1939 | Berch ....................... 229/125.28 |
| 2,517,552 A | * | 8/1950 | Field ............................ 229/110 |
| 2,917,222 A | * | 12/1959 | Frankenstein ................ 229/110 |

(Continued)

FOREIGN PATENT DOCUMENTS

| BE | 410524 | 8/1935 | |
| FR | 2635313 A1 | * 2/1990 | ............... B65D 5/08 |
| GB | 2371289 | 7/2002 | |
| GB | 2079252 | 11/2006 | |

OTHER PUBLICATIONS

The Written Opinion of the International Searching Authority.

*Primary Examiner* — Gary Elkins
*Assistant Examiner* — Christopher Demeree
(74) *Attorney, Agent, or Firm* — K&L Gates LLP

(57) ABSTRACT

A container for holding a product, preferably a product in pieces, in particular an edible product, such as sweets, chocolates and the like. The container consists of a container body and comprises product side and base retaining means and at least one outlet opening through which the product comes out. The container body has a polygonal base and there are container closing means, consisting of a lid for closing the product outlet opening, which is suitably connected to the container body.

47 Claims, 8 Drawing Sheets

(56) References Cited

U.S. PATENT DOCUMENTS

| | | | |
|---|---|---|---|
| 3,101,167 A * | 8/1963 | Styler | 229/108.1 |
| 3,174,675 A * | 3/1965 | Rosenburg, Jr. | 229/108.1 |
| 3,265,282 A | 8/1966 | Maxwell | |
| 4,205,775 A * | 6/1980 | Swan | 229/104 |
| 4,362,266 A * | 12/1982 | Webinger | 229/110 |
| 4,913,292 A | 4/1990 | Field | |
| 5,887,781 A * | 3/1999 | Marx et al. | 229/120.32 |
| 6,363,696 B1 | 4/2002 | Tisma | |

* cited by examiner

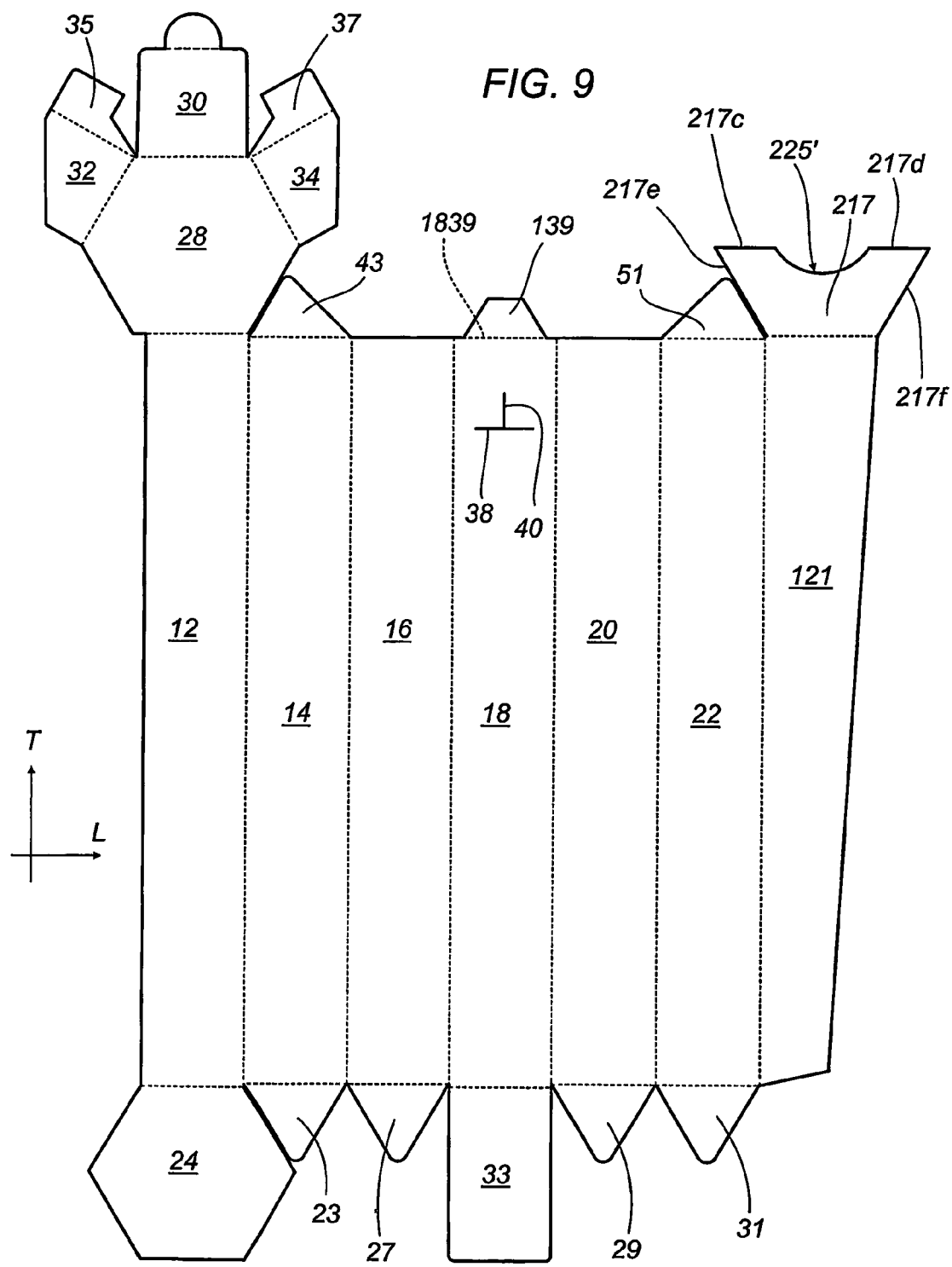

CONTAINER FOR PIECE GOODS

BACKGROUND

The present invention relates to a container for holding a product, preferably a product in pieces, in particular an edible product, such as sweets, chocolates, comfits and the like.

The present invention also relates to a blank for obtaining the container, and the use of the container, in particular for packaging a product in pieces, especially an edible product.

A tubular container of the known type comprises a tube-shaped cardboard container body with a round base, with an outlet at one end through which the product comes out. The product consists of small disc-shaped comfits. The product outlet opening is closed by a separate cap made of plastic. However, this plastic cap has a disadvantage in that it may be ingested by a child, presenting a serious health risk, and can also easily be lost, that is to say, as often happens, it may go inwards, jamming inside the tubular body, and so preventing the container from being closed correctly.

In particular, this known tubular container normally holds edible disc-shaped comfit products with a generally spherical upper and lower surface with a wide radius of curvature. In this type of known tubular container, the excessive speed with which the products come out of the container, and the excessive quantity of products at the outlet opening, cause a problem in terms of the consumption of these edible products, especially by children, who often put the tubular container directly to their mouths and tip it until the products begin to come out. When this is done, products come out extremely fast, as well as in large amounts, and the comfits, which are swallowed, risk causing the child problems, both in terms of pieces which go down the wrong way, blocking the respiratory tracts, and in terms of non-optimum digestion—classic stomach pains—due to eating too much confectionery. In practice, for the above reasons, the use of that type of pack for such edible products is not approved by parents, who prefer not to buy that type of pack, with consequent economic losses for the companies which make such confectionery.

The Applicant has noticed that, in these known tubular packs, when the disc-shaped products or comfits are conveyed towards the open side where the products come out, they slide, many making contact with the inner surface of the tube only at their side and lower edges, thus creating little friction with the sliding surface of the tubular body, and so resulting in the products coming out of the pack too fast.

Containers are also known for edible products in pieces, such as sweets, chewing gum and the like, the containers having a container body with a rectangular base with panels which form the front and rear walls. The latter are rather wide (the width of the front and rear walls is more than double the width of the side walls of the container body). This type of container has rather limited deformability.

Moreover, the rectangular containers have a lid which has, on the inside of its front wall, a pair of teeth which engage by snapping onto a corresponding extended tooth which extends practically along the entire front wall of the container body, to form a snap closure, well-known in the sector, which allows the container to be opened and closed a number of times.

In this type of container, known and not tubular, the upper product outlet opening, which is as wide as the side of the container it is made in, is too large. When the container is tipped a large and excessive number of products come out of the opening, haphazardly and not aligned, which cannot all be consumed and are often put back into the pack, this operation not being very hygienic.

Moreover, in such known packs, the large retaining tooth, which makes contact with the inner surface of the front panel of the lid, like the sliding contact between the surfaces of the side panels of the container with the inner surface of the upper panels of the lid, hold the lid in the closed position, even when the snap closure has not actually been engaged. The result is easy opening and products coming out of such types of containers, especially when they are carried in handbags or the like, and when they are subject to continuous stresses, for example caused by the user walking about.

Rectangular containers are also known in which there are front and rear walls, at the short sides of the container body, and which have a "flip-top" type lid, having, on the inside of its narrow front wall, a pair of teeth which engage by snapping onto a corresponding tooth or tab on the narrow front wall of the container body.

Again in this type of non-tubular container, the sliding contact between the surfaces of the sides panels of the container with the inner surfaces of the side panels of the lid, causes the lid to be held in a substantially closed position, even when the snap closure has not actually been engaged. The result is easy opening and products coming out of this type of pack, especially when carried in handbags or the like, and when subject to continuous stresses.

Moreover, in such known containers with a rectangular base, closing and/or opening of the flip-top lid is not optimum, the walls which support the parts that engage with one another being either too deformable or not deformable enough.

In particular, in the case of rectangular packs with an opening on the short side of the pack, there is a supporting assembly for the snap-shut retaining means for the lid on the container body, which is too rigid, making it difficult to use or, sometimes, leading the engagement means to wear out rapidly.

Moreover, it should be noticed how for these rectangular, non-tubular packs, to ensure that the container can be easily handled by the user, the geometrical dimensions of the container are reduced, with a corresponding disadvantageous reduction in the amount of products it can hold.

As regards the rectangular packs with retaining means for closure along the long side, the excessive deformability of the long front wall necessitates the use of a retaining tab extending from this wall of the container body, which is long, extending sideways until it almost reaches the side edges of the front wall. However, this retaining assembly cannot always be securely operated.

Hexagonal cardboard tubular containers are also known, which are used to hold chocolates, packaged in special bags, being flat and with a diameter substantially corresponding to the diameter inscribable within the transversal profile of the inner surface of the container, the chocolates being removed, all together, with the single bag that contains them, from a completely open end of the tubular body. These tubular containers with a hexagonal base, with sides or walls of equal width, maintain the required stiffness thanks to the presence of the product held inside them. However, when this type of container is emptied, the container sags disagreeably or becomes too deformable. Moreover, these known hexagonal containers do not have suitable means for closing the opening through which the pieces of product come out, once opened, since the pieces of product easily remain in the container, thanks to the bag which contains them and, to a certain extent, thanks also to the friction between the outer edge of this bag and the inner edge of the container.

SUMMARY

A container is therefore provided for holding a product, preferably a product in pieces, in particular an edible product, such as sweets, chocolates, comfits and the like; the container consists of a retaining body and comprises side product retaining means and at least one outlet opening through which the product comes out. The container is characterised in that the container body is a tubular body with a polygonal base; and in that in practice there are container closing means, consisting of a lid for closing the product outlet opening, the lid extending from the container body and being connected to it.

This avoids the risk of losing the lid or of it being ingested by a child.

Other advantageous aspects of the present container are described in the other claims.

The other claims also describe an advantageous blank for obtaining the container, and an advantageous use of the container to package a product, in particular a product in pieces, especially an edible product, and an advantageous pack consisting of the container combined with the product inside it.

Additional features and advantages are described herein, and will be apparent from, the following Detailed Description and the figures.

BRIEF DESCRIPTION OF THE FIGURES

FIG. 9 is a schematic plan view of a blank sheet from which the fourth preferred embodiment of the container is made;

DETAILED DESCRIPTION

Figure 1:
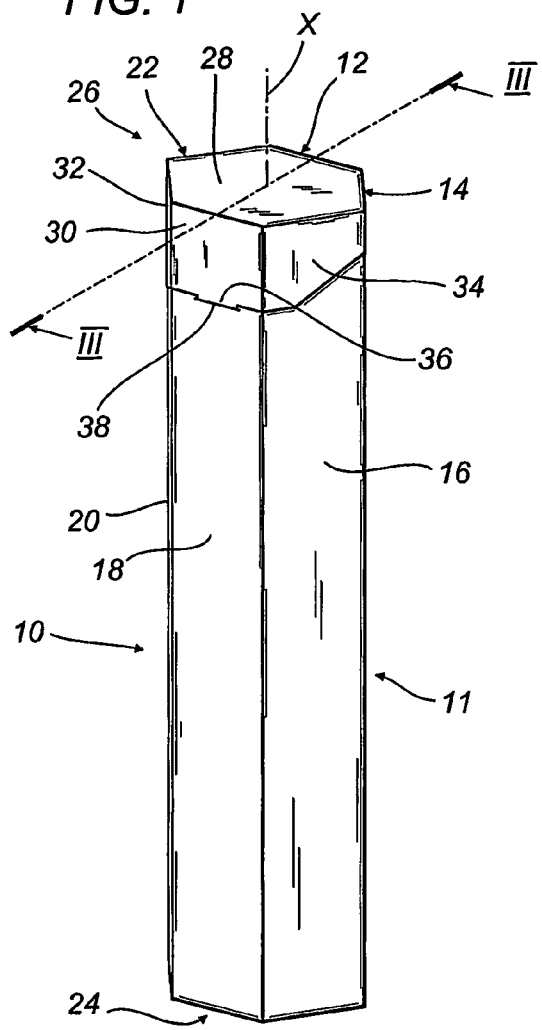
FIG. 1 is a schematic perspective view of a first preferred embodiment of the container, in the closed condition.

FIGS. 1 to 4 illustrate a first preferred embodiment of a container for holding a product, preferably a product in pieces, in particular an edible product, such as sweets, chocolates and the like.

The container is intended in particular for holding pieces of product whose width or diameter is noticeably smaller than the diameter inscribable in the cross-section of the container. In practice, with the present embodiment of the container the products can easily be conveyed to the outlet opening, making them slide only against the walls of the container body at the outlet opening, described in more detail below. These walls therefore form an advantageous product guide channel.

In more detail, the container 10 comprises a container body 11, with suitable product side retaining means consisting of a plurality of outer walls, forming a tubular container body which has a hexagonal base.

The term tubular container body here refers to a container body which has a central axis or axis of substantial symmetry for the external walls of the container body. In particular, the accompanying drawings illustrate, with a dot-dash line, an axis of symmetry "X" of the tubular body, relative to which the tubular body extends with substantial radial specularity, preferably remaining inscribed within a corresponding virtual or imaginary circle (not illustrated in FIG. 3).

However, it should be understood that the various advantageous aspects of the embodiments illustrated, although preferably and advantageously applied to tubular containers can also be imagined for other container packs, not necessarily tubular.

Moreover, although this hexagonal shape is particularly preferred, a container with a general polygonal base shape may be imagined.

The polygonal shape illustrated has regular sides, that is to say, sides which are equal in width. However, a container body with sides which have different widths may also be imagined, that is to say having sides with widths not too different from one another, or substantially equal.

The preferred polygonal shape illustrated allows a container to be obtained which is suitable for occupying a limited space, in terms of width, and which can easily be gripped by the user.

In particular, the present container body comprises a front wall 18, a rear wall 12—parallel with the front wall 18—a pair of front side walls 16 and 20, each extending from the side of the front wall 18, and a pair of rear side walls 14 and 22, each extending from the side of the rear wall 12 and joining, at the other edge, with the corresponding longitudinal edge of the respective front side wall 16, 20.

Figure 4:
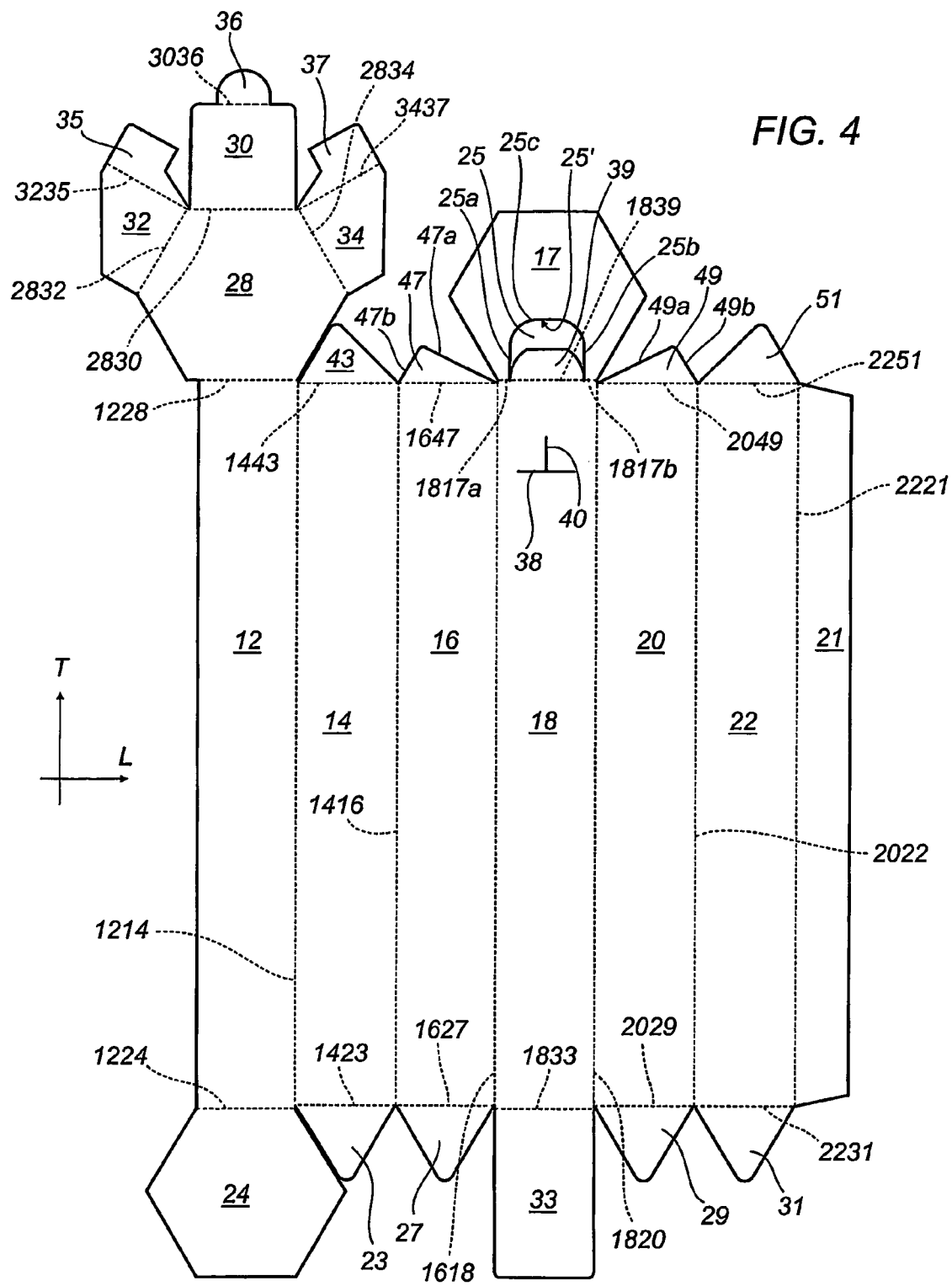
FIG. 4 is a schematic plan view of a blank sheet from which the first preferred embodiment of the container is made.

As illustrated in the flat blank in FIG. 4, from which the present container is obtained by suitable folding and gluing, each outer wall is connected to the adjacent outer walls, by pre-creasing or fold lines 1214, 1416, 1618, 1820, 2022, which extend longitudinally.

In the conventional way and to make it easy to describe, in FIG. 4 the letter L denotes a longitudinal reference axis, which defines the prevalent direction in which the blank extends, and the letter T denotes a transversal axis, at a right angle to the axis L.

As illustrated in the blank in FIG. 4, the dashed lines illustrate fold or pre-creasing lines in the components of the blank, and the continuous lines illustrate cutting lines used to create the blank.

Moreover, from the flat blank in FIG. 4, it can be seen how the number reference 21 denotes another outer panel which, when making up the present pack, is glued to the rear panel 12 and joins the rear panel 12 to the side panel 22 of the container body. As illustrated, the joining panel 12 is separated from the panel 22 by a longitudinal pre-creasing or fold line 2221. When the container has been made up, the joining panel 21 is glued, or joined, with its outer surface or face in contact with the inner surface or face of the rear panel 12.

As illustrated, the container also comprises a base wall 24 for retaining the product held in the container from below, which may have any polygonal shape, but which is, as illustrated, preferably hexagonal.

This base wall 24 consists of a transversal panel with a hexagonal edge, extending from one lower longitudinal pre-creasing or fold edge 1224 of the rear outer wall 12 of the container body, and, with the container made up, it is connected to corresponding side outer walls by means of lower tabs 23, 27, 29, 31, that are triangular or have any other required shape, extending, thanks to corresponding pre-creasing or fold lines 1423, 1627, 2029, 2231, from the outer walls 14, 16, 20, 22, of the container body and glued to the inside or upper side of an elongated quadrangular tab 33, in turn extending from the lower edge or pre-creasing line 1833 of the front wall 18 of the container body.

This tab 33 also retains the transversal base wall 24, which is glued to the outer or lower face of the panel 33 and could have any other required shape, for example, a hexagonal profile.

Figure 2:
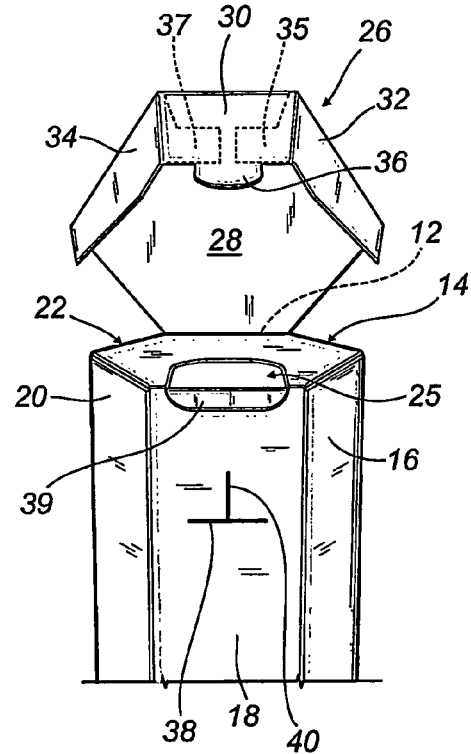
FIG. 2 is a schematic perspective view of the upper part of the first preferred embodiment of the container, in the open condition.

As illustrated in FIG. 2, at one upper end or side of the container there is a convenient product outlet opening 25, described in further detail below.

Advantageously, there are also means 26 for closing the product outlet opening of the container, located at the end, or side, opposite the base of the container.

The container closing means are, in particular, a lid 26 for closing the product outlet opening 25, which is suitably connected in a tilting fashion to the container body 11.

The lid 26 comprises a flat transversal or perpendicular wall 28, with a polygonal profile, in particular hexagonal, whose outer edges are substantially on the extension of the upper side walls of the container body when the container is made up.

As illustrated, the upper panel 28 of the lid extends with an outer profile at or substantially overlapping the upper profile formed by the outer walls of the container body.

The lid also comprises a front longitudinal or side wall 30, designed, in the closed position, to partially overlap the corresponding front wall 18 of the container body at the upper end. The front outer wall 30 of the lid extends from the panel 28, forming the upper transversal wall of the lid, to which it is connected by means of a pre-creasing or fold line 2830, illustrated in FIG. 4.

The lid also comprises a first and a second front side wall 32, 34. These outer walls 32, 34 of the lid extend from corresponding edges on the side of the upper panel 28 opposite the one joined to the outer wall 12 of the container body, and are designed, in the closed position, to partially overlap corresponding front side outer walls 16, 20 of the container body at the upper end.

In particular, as illustrated in FIG. 4, these front side walls of the lid extend from the panel 28 which forms the upper transversal wall of the lid, and are connected to it by pre-creasing lines 2832, 2834.

There are also suitable connecting means between the lid 26 and the main body 11 of the container, comprising a connecting or pre-creasing line 1228, which forms a hinge for rotation of the lid relative to the rear outer wall 12 of the container body. In practice, the panel 28 is connected to the panel 12 forming the rear outer wall of the container body by the pre-creasing line 1228.

There are also retaining means for holding the lid 26 closed, in particular located on the opposite side to the hinge or connection to the container body.

Figure 3:
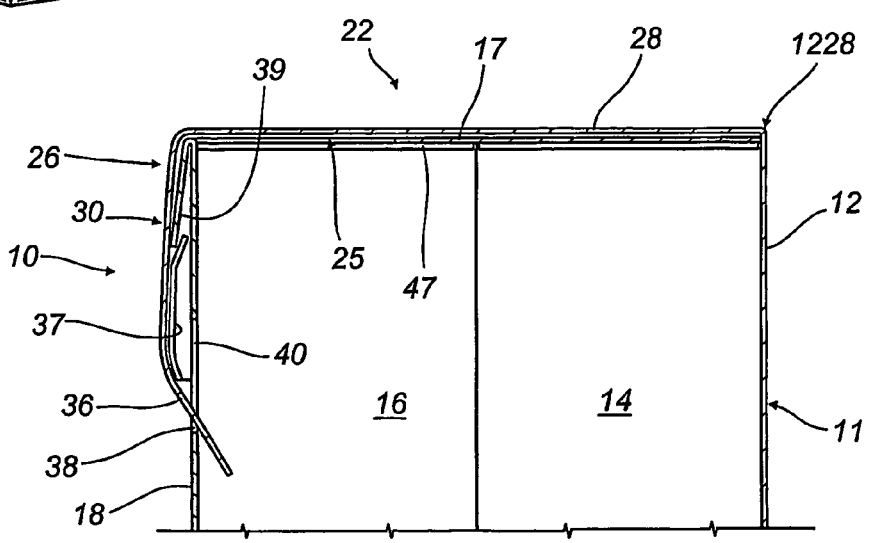
FIG. 3 is a schematic cross-section according to line III-III illustrated in FIG. 1 of the upper part of the first preferred embodiment of the container.

As illustrated in FIGS. 2 and 3, these retaining means for holding the lid closed comprise engagement means, on the lid 26, comprising a first 35 and a second 37 tooth located, when the container is made up, at the inner face of the front outer wall 30 of the lid. Each of the teeth extend from the corresponding front side outer wall 32, 34 of the lid, to which they are connected by fold or pre-creasing lines 3235, 3437, and which extend from the side opposite that of connection to the rear wall 12.

The teeth 35, 37 on the lid operate in conjunction with engagement means located on the container body 11 and comprising, in particular, a tab or tooth 39, located at the outer face of the corresponding front outer wall 18 of the container body.

As illustrated, the tooth 39 extends from an upper edge or pre-creasing line 1839 of the outer wall 18 of the container body.

As illustrated in FIG. 3, the teeth 35 and 37 on the lid (only tooth 37 is illustrated in the cross-section in FIG. 3) have, when engaged, their upper edge engaged with the lower end of the tooth 39 on the container body. In this condition, the tooth 39 is pointing downwards, substantially parallel with the front face 18 of the container body. Engagement between the lid retaining means on the lid and those on the container body occurs with a snap action when, after the user has forced the front part of the lid downwards, and the outer or front face of the tab 39—pointing downwards—slides over the inner face of the retaining teeth on the lid and, finally, impacts, with an elastic snap action, against the inner face 30' of the front wall 30 of the lid, producing a characteristic contact noise, similar to a kind of "click", with the lower end of the tooth 39 on the container body making contact with the upper edges of the teeth 35, 37 on the lid. Disengagement of the lid retaining means on the lid and those on the container body occurs, with a snap action—thanks to the user pushing or pulling the lid upwards—when, after forcing the front part of the lid upwards, by bending the tooth 39 upwards, the upper edges of the teeth 35, 37 on the lid disengage from the lower edge of the tooth 39. In this situation, to facilitate disengagement, the front wall flexes or moves slightly backwards.

It should be noticed that, in the retaining condition, the position of the engagement teeth 35, 37, 39 is such that, to a certain degree, they force the lower surface of the upper wall 28 of the lid against the opposite parts of the container body 11, creating pack closing with a high level of "sealing".

These lid retaining means also comprise engagement means located on the lid 26 comprising a tab 36, extending from the lower edge of the front panel 30 of the lid, from which it is separated by a join line 3036.

The tab 36 is designed to be inserted in a corresponding horizontal slot 38, in the upper part of the front wall of the container body. A second, vertical slot 40 extends from the middle of the slot 38, to facilitate insertion of the engagement tab 36 in the slot 38.

Advantageously, there are also container body stiffening means.

In particular, there are container stiffening means for the open container, located at the product outlet opening 25, at an upper end of the container body, consisting of container body twisting and bending stiffening means.

These stiffening means comprise at least one transversal portion 17, connected to various points of the outer walls of the container and designed to counteract relative rotation between the walls connected.

In particular, the stiffening means consist of a transversal panel 17 extending from one end of a longitudinal outer wall, in particular from the front outer wall 18 and connected, by suitable connecting means, to at least several of the other outer walls of the container.

In particular, in this first preferred embodiment of the container, the transversal stiffening wall is connected to the front side walls 16, 20 and to the rear side walls 14, 22, by triangular tabs, which may have any other suitable shape, 43, 47, 49, 51, extending, by means of pre-creasing or fold lines 1443, 1647, 2049, 2251, from the side walls 14, 16, 20, 22, rear and front walls, to the top of which the transversal wall is fixed by special adhesive means preferably consisting of spots of glue.

There are also means for covering the container body opening, extending from the upper edges of the side walls of the container body, in particular, from the rear side walls of the container body.

The means for covering the container body opening consist of the transversal panel 17, forming the stiffening means, and allowing the zone at the rear side walls which is not protected by any lid longitudinal outer wall to be covered. This guarantees suitable protection for the product in the container. The transversal wall 17 also extends beyond the zone which is not protected by a lid side or longitudinal wall, at the upper edges of the front side walls. This guarantees a certain protective overlap in the zone between the zones that are not protected by the lid side walls and the zones that are protected by the lid front longitudinal walls 32 and 34.

In the transversal closing wall there are opening means with predetermined extension suitable for allowing the passage of a predetermined number of pieces at a time, in particular a limited number of pieces, preferably one piece at a time, of the product in the container.

Advantageously, the product outlet opening is made thanks to a notch formed by an edge 25' in the transversal stiffening and/or covering wall, with rounded side linear sections 25a and 25b, having large curves, a linear section 25c transversal to the latter and parallel with the front wall of the container body. In this way, together with the upper edge of the outer walls of the container body it forms a suitable shape for the product outlet opening, suitable for the passage of pieces which are disc-shaped, round or the like.

The opening extends, on the front of the corresponding transversal face, from the upper edge of the front wall of the container body.

In a suitable way, the opening 25 has a profile with predetermined dimensions, to allow the passage of the required number of products each time.

Therefore, the rear and the side of the opening 25 are formed by the edge 25', which has an arched rear section joined to straight side sections of the edge 25', at the front of the central portion of the upper edge of the container body front wall 18.

In practice, the transversal stiffening and/or covering wall is fixed to the front wall 18 of the container body, at two container points or side pre-creasing sections 1817a and 1817b.

In the transversal wall 17, in the space forming the opening 25, there is also the engagement and retaining tooth 39 for a lid.

The tooth 39 extends from the upper edge 1839 of the front outer wall 18 and points forwards to form the lid engagement means.

The tabs for connection to the transversal wall 17, extending from the outer walls are, appropriately, shaped in such a way that they do not interfere with the product coming out.

The tabs 47 and 49, extending from the front side walls 16 and 20, have an asymmetrical edge 47a, 49a pointing towards the front part which is suitably shaped, having an angle smaller than the other edge 47b, 49b, pointing towards the rear of the lid.

It may be seen how advantageously preparing a lid with only front side walls on the sides, it is possible to obtain secure, easy lid opening, without producing any interference with the side walls of the container body 11.

Figure 5:
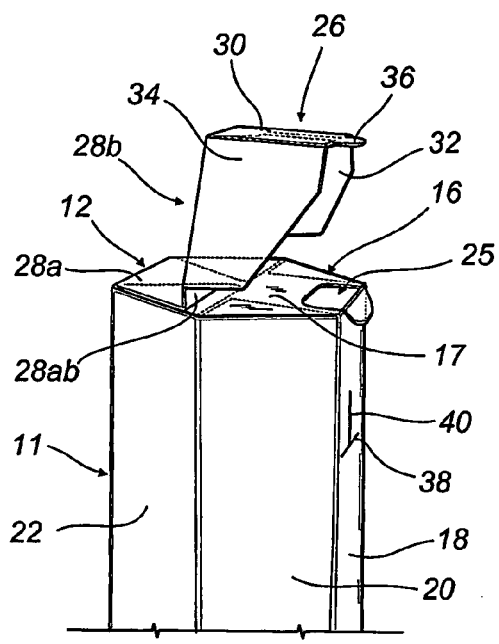
FIG. 5 is a schematic perspective view of the upper part of a second preferred embodiment of the container.

According to a second preferred embodiment, illustrated in FIG. 5, the lid comprises a rear portion 28a of the lid, which is fixed, preferably by glue, to the container body, preferably on the container body transversal panel 17, and a front portion 28b, with the side walls 30, 32, 34 and the engagement means, which is joined to the fixed portion 281 of the container body along a pre-creasing or fold line 28ab. This intermediate pre-creasing line 28ab on the transversal panel 28 of the lid is parallel with the container body rear wall 12 and at an intermediate zone between the upper point of the front longitudinal edge 1416 and 2022 of the rear side walls and the upper edge of the container body rear wall 12. In this case, the rear fixed part 28a of the lid can be used as another stiffening panel or an alternative to the stiffening panel 17, or, even, in the absence of the transversal panel 17, it can be used to form an opening with predetermined size for the product to come out of. As illustrated in FIG. 3, when closed, the lid, in particular its upper wall 28, is held in contact with the stiffening panel 17 below.

According to another two preferred embodiments, illustrated in FIGS. 6 to 9, which, to avoid complicating the description, have the same number references for the same elements as in the first preferred embodiment described above, it may be seen how a transversal stiffening and closing wall can extend both from the front and rear side walls, or from the rear side walls only.

Figure 6:
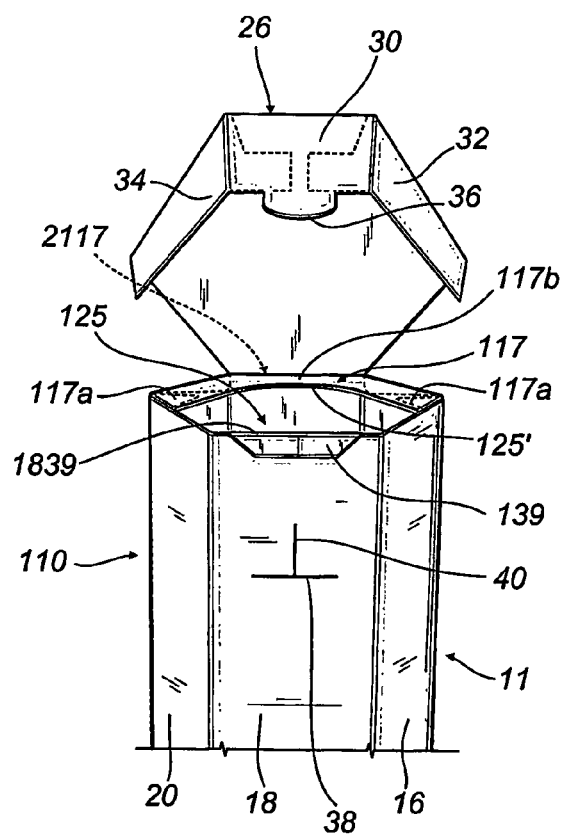
FIG. 6 is a schematic perspective view of the upper part of a third preferred embodiment of the container, in the open condition.
Figure 7:
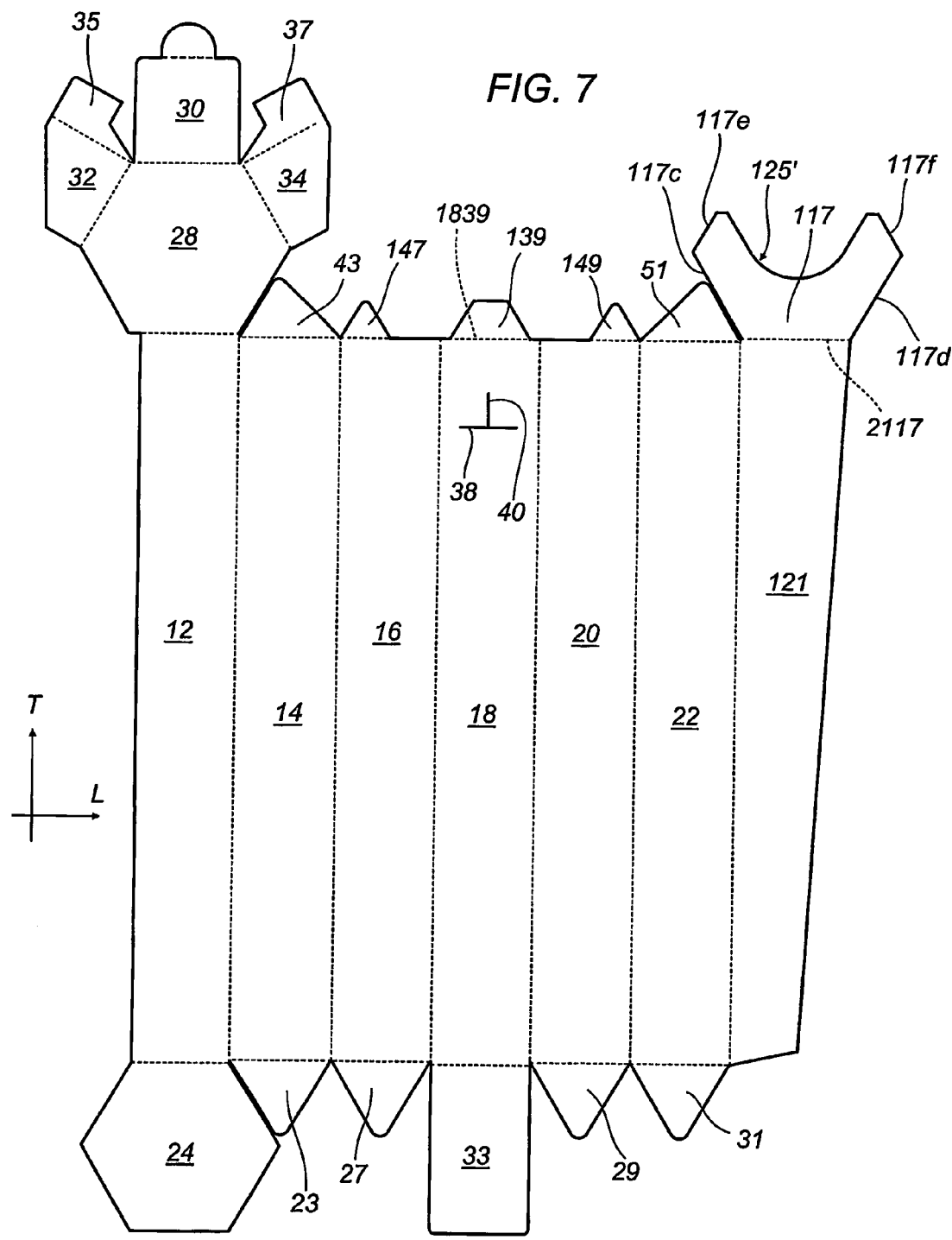
FIG. 7 is a schematic plan view of a blank sheet from which the third preferred embodiment of the container is made.

In particular, as illustrated in FIGS. 6 and 7, according to a third preferred embodiment 110, it may be seen how an upper stiffening or covering panel 117 may be connected to the rear side walls of the container body and to the front side walls, by means of tabs. The tabs 43 and 51 extend from the rear side walls 14 and 22 of the container body and are similar to those of the first preferred embodiment, whilst the tabs 147 and 149, extending from the front side walls 16 and 20 of the container body are again triangular, although smaller and only at the rear of the upper edge of the front side walls 16 and 20.

These stiffening means comprise at least one transversal portion 117, connected to various points of the outer walls of the container and designed to counteract relative rotation between the walls connected and so, as a whole, between all of the walls of the container main body.

In this third embodiment, the stiffening panel 117 forming the opening 125 extends from a panel 121 attached, preferably by glue, to the inner face of the rear wall 12. The front of the panel 117 separated from the joining panel 121 by a pre-creasing line 2117, forms an edge 125', pointing towards the front of the container body, extending in a curve with the concave part towards the front of the container body. Number references 117c, 117e, 117d and 117f denote the edges of the stiffening panel which, with the container made up, coincide with or are on the extension of the corresponding rear and front side walls of the container body.

There are stiffening means between each front side wall 16, 20 and the adjacent rear side wall 14, 22, thanks to the corresponding side portion 117a, 117a of the wall 117.

There are also stiffening means between each rear side wall 14, 22 and the rear wall 12 of the container body, thanks to the corresponding rear portion 117b of the wall 117.

There is a single stiffening panel between the rear and side (rear and front) walls, extending substantially in the plane formed by the upper edges of the container body outer walls to which it is connected.

In this third embodiment, the lid retaining tooth 139, extending from the upper edge of the container body front wall, has a trapezoidal shape, with converging side edges, as clearly shown by the cardboard blank in FIG. 7. As shown by this embodiment, and similarly to the other embodiments illustrated, the retaining tooth 139 on the body has reduced width, slightly smaller than the width of the container body front wall.

This gives a mouth or product outlet opening 125, the rear and rear side of which is formed by the arched section 125', whilst the front is formed by the upper edge of the container body front wall 18, and the front side is formed by the front part of the upper edges of the side walls 16, 20, extending at an angle or obliquely relative to the container body front wall 18, diverging towards the rear of the container.

Figure 8:
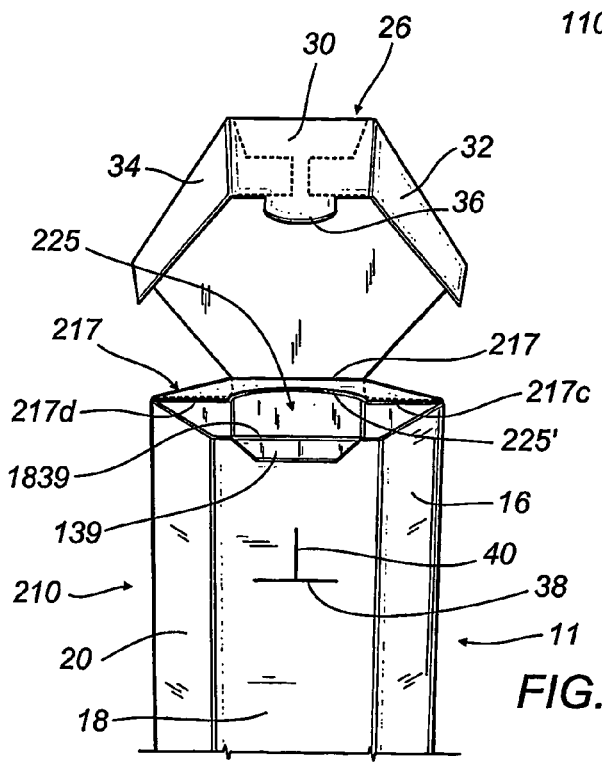
FIG. 8 is a schematic perspective view of the upper part of a fourth preferred embodiment of the container, in the open condition.

In particular, as illustrated in FIGS. 8 and 9, according to a fourth preferred embodiment 210, in which the elements common to the previous embodiments are labelled with the same number references as used in the others, it can be seen how there can be an upper stiffening or closing panel 217 connected only to the rear wall and to the rear side walls of the container body.

In this fourth embodiment only the tabs 43 and 51 are present, extending from the container body rear side walls 14 and 22. In this fourth embodiment, the stiffening panel 217 which also forms the opening 125 has an edge 225', facing the front of the container body, which extends in a curve towards the rear of the container body. Number references 217c and 217d denote the front edges of the stiffening panel, extending towards the inside of the container, from the point at the end or edge of the rear side walls, connected to the front side walls of the container body. These edges 217c, 217d extend substantially parallel with the front wall of the container body.

There are also edges 217e and 217f which, when made up, are located on the extension of or substantially at the upper edges of the container body rear side walls.

According to another preferred embodiment, not illustrated in the accompanying drawings, there may also be a product outlet opening contact channel, consisting only of a first and a second wall adjacent to one another and positioned in such a way as to form an angled or "V" shape, which advantageously guides or channels the product coming out of the container opening, in particular when a powder product or a product consisting of very small pieces is to be conveyed to the opening. The product outlet opening, therefore, has a "V"-shaped guide channel at a suitable end.

The material used to make the present container is preferably cardboard. The container body disclosed by the present invention preferably has a hexagonal base. However, the container body base may be triangular, or may have five, eight or as many other sides as required, and it may have a quadrangular shape, in particular that of a square, a trapezium or other shape.

In the container disclosed, the stiffness or deformability of the front wall of the present embodiment is optimum and so allows, in practice, a secure and effective container opening and closing action. This optimum stiffness or deformability for the walls supporting the snap engagement and disengagement means is achieved particularly thanks to the deformability of the set of oblique side walls, relative to the front wall, to which the wall supporting the engagement tooth is connected. Advantageously, these oblique side walls are at an obtuse angle, greater than 90° to the wall supporting the tooth.

In the present preferred embodiments, when closed, the lid also advantageously forms means for stiffening the container while it is covered.

Figure 10:
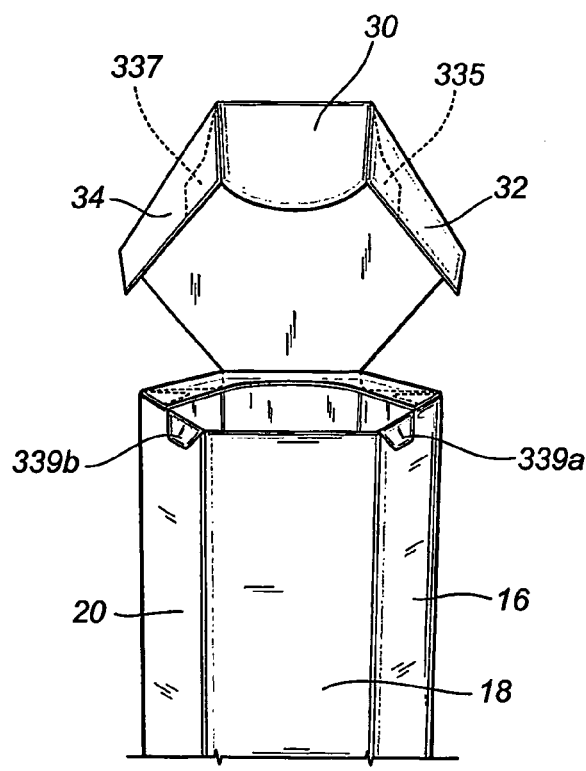
FIG. 10 is a perspective view of the upper part of a fifth preferred embodiment of the container, in the open condition.
Figure 11:
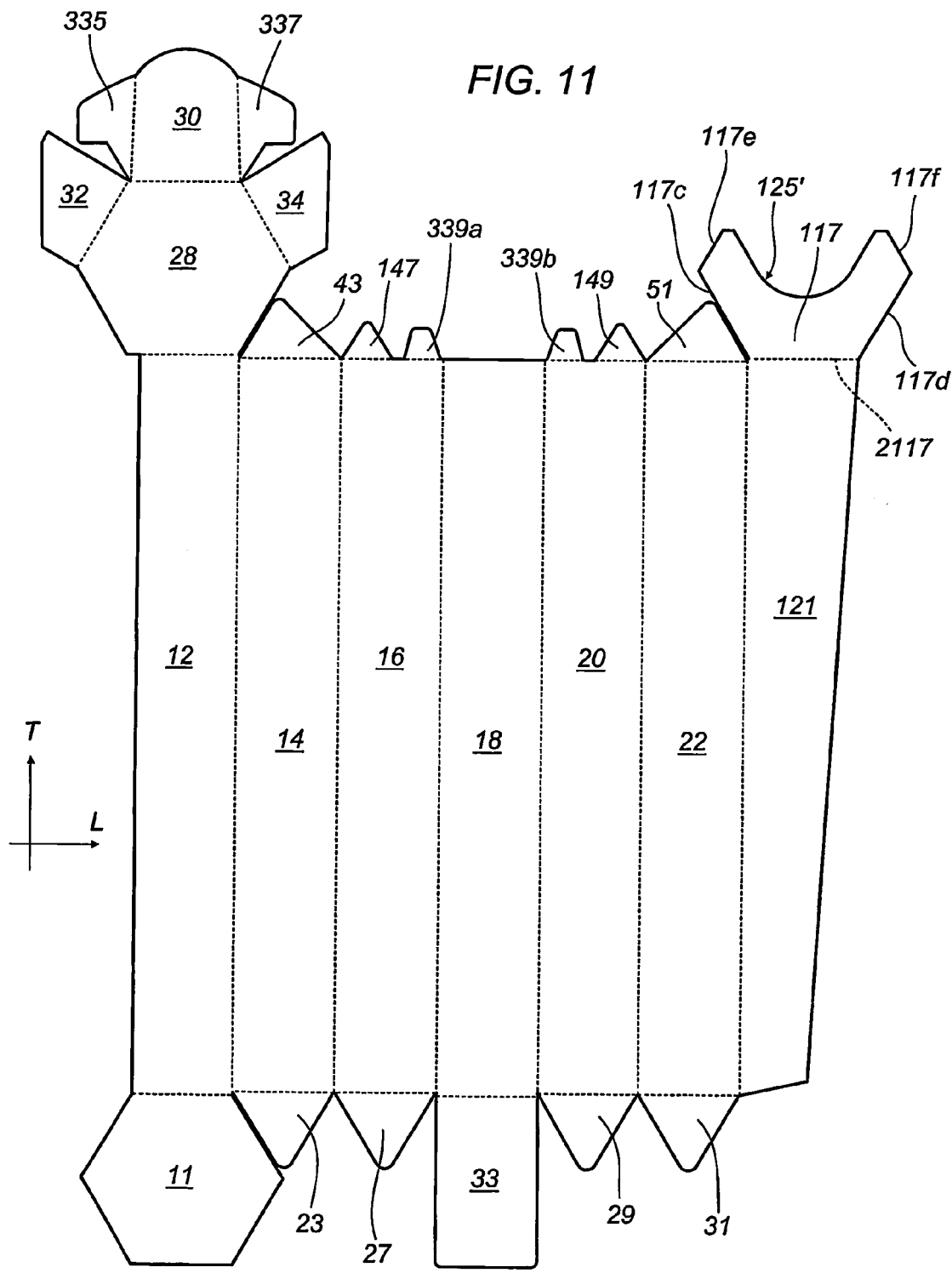
FIG. 11 is a schematic plan view of a blank sheet from which the fifth preferred embodiment of the container is made.

A fifth preferred embodiment is illustrated in FIGS. 10 and 11, in which the same number references as for the previous preferred embodiments described above are used to avoid complicating the description.

This fifth embodiment of the container illustrates another advantageous embodiment of the retaining means for holding the lid snapped shut on the container body.

This fifth embodiment of the container comprises advantageous engagement means 335, 337 on the lid, at the inner face of the corresponding front side wall 32, 34 of the lid.

These retaining means on the lid comprise a first and a second tooth or tab 335, 337, each extending sideways from the side edge of the front wall 30 of the lid.

There are also engagement means on the container body, designed to operate in conjunction with the engagement means 335, 337 on the lid to hold the lid in place.

The engagement means on the container body are a first and a second engagement tooth 339a and 339b, at a container body front side wall 16, 20, each extending from the front of the upper edge of the corresponding outer wall 16, 20.

Figure 12:
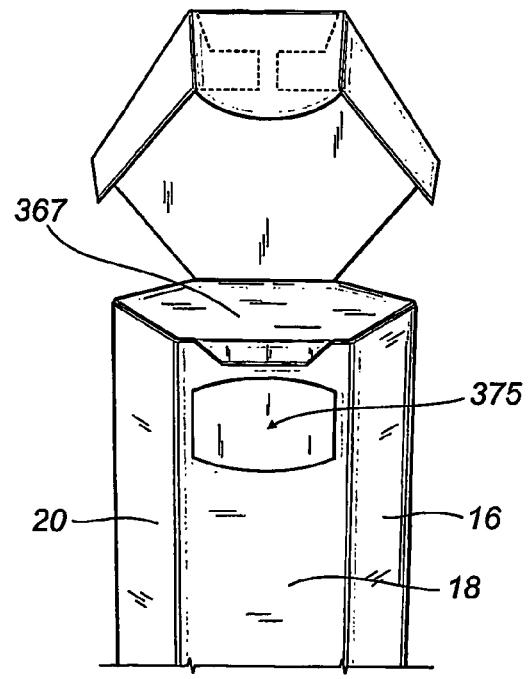
FIG. 12 is a perspective view of the upper part of a sixth preferred embodiment of the container, in the open condition.

A sixth preferred embodiment is illustrated in FIG. 12, in which the same number references as for the previous preferred embodiments described above are used to avoid complicating the description.

This sixth embodiment of the container comprises advantageous product outlet means, in particular in the form of a single product outlet opening 375, which opens close to the upper edge of the container body front wall 18.

In this sixth embodiment, unlike the other embodiments of the container illustrated, the upper stiffening wall 367 has an external profile which substantially coincides with the outer profile of the container body, extending at the upper edges of the front, rear, front side and rear side walls.

Figure 13:
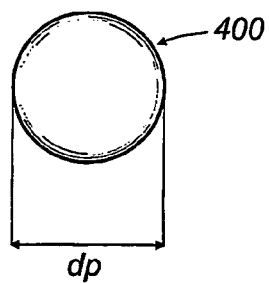
FIG. 13 is a schematic top plan view of piece of product packaged in the container.
Figure 14:
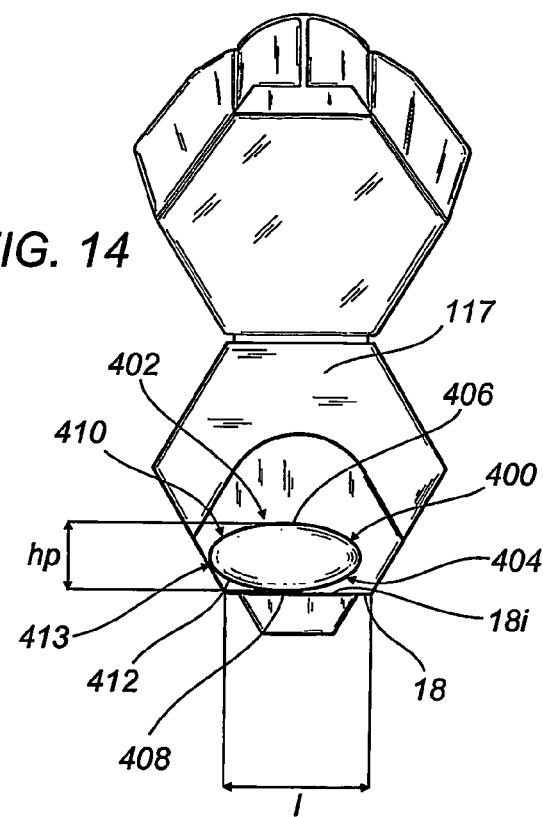
FIG. 14 is a schematic front view of a pack with the product packaged in it sliding towards the container outlet opening.

FIGS. 13 and 14 illustrate a piece 400 of a disc-shaped edible product, with a predetermined diameter, labelled "dp" in FIG. 13 and a height labelled "hp" in FIG. 14.

The piece or comfit 400 has an upper surface 402 and a lower surface 404 which are substantially symmetrical relative to a middle plane. Each of the upper and lower surfaces 402 and 404 has a central portion 406, 408 with a rather large radius of curvature, and a side circumferential portion 410, 412, where it joins to the opposite lower or upper surface 404 or 402, with a narrower radius of curvature.

The present pack, in particular, as illustrated in the third preferred embodiment 110, holds a large quantity of disc-shaped comfits or pieces, allowing them to come out easily, in particular using the channel made by the front wall and the angled side walls extending from the front wall.

Figure 15:
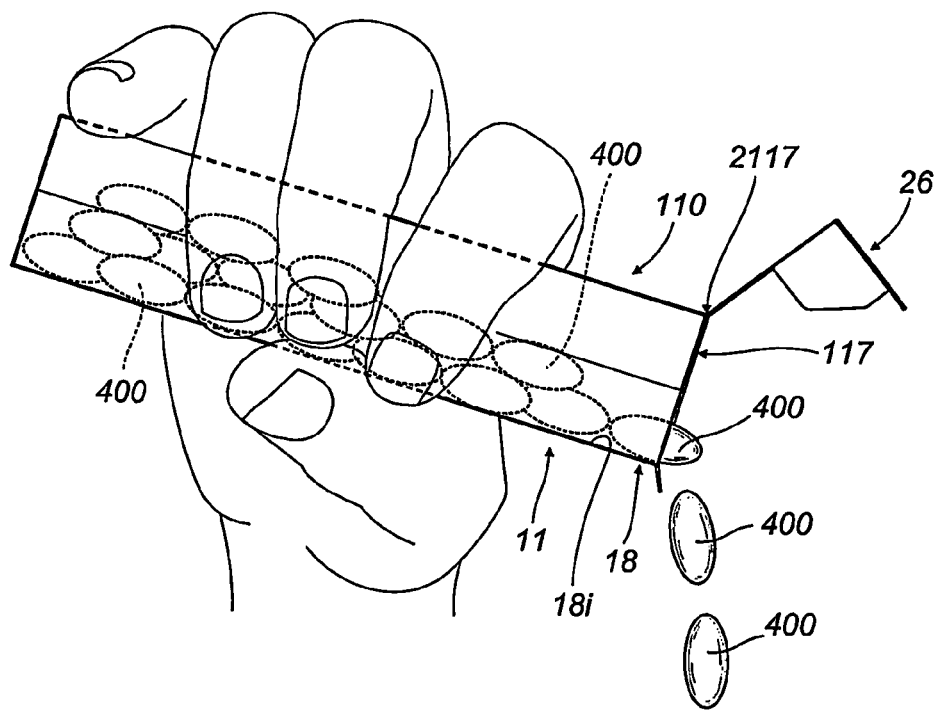
FIG. 15 is a schematic side view of a pack with the product coming out of it.

In practice, the comfits are preferably channeled one after another so that they come out of the product outlet mouth one at a time, as illustrated in FIG. 15. The comfit mainly slides with the lower surface 408 in contact with the inner surface of the front wall 18 of the pack and sometimes with a side portion 413, of the comfit 400, in contact with a side wall of the container, as illustrated in FIG. 14. This relatively reduces the product sliding speed towards the outlet opening and prevents the product from coming out too quickly, which is the case with known packs, thus avoiding suddenly filling the user's hand or mouth with a large quantity of products. Contact between the lower surface of the piece 400 with the large curvature 408 and the inner surface 18i of the front wall 18 creates significant friction compared with what happens with previously known packs for such products.

As shown in FIGS. 14 and 15, this third preferred embodiment 110 of a pack advantageously has an opening 125 with a shape and dimensions which allow just one comfit 400 at a time to come out.

With the present pack, which has diverging walls, it is possible to channel disc-shaped pieces with a diameter "dp" greater than the width "l" of the front guide wall.

The pack disclosed is very manageable. It can easily be gripped (as illustrated in FIG. 15) by the user, for example a child, and can also hold a relatively large quantity of edible product.

Therefore, with the pack disclosed it is possible to obtain a tubular body which is extremely effective in use and which is extremely easy to make, any work on machines required to produce it being very simple.

This pack with a polygonal base has a comparatively large capacity and closure of the upper product outlet opening provides an especially "effective seal", since the engagement and retaining means which hold the lid snapped shut on the body are located at the front wall which is opposite the rear where the rotation hinge which connects the lid to the container body is positioned.

By preparing a lid with only front side walls, it is possible to achieve easy and secure lid opening, without substantial rubbing of the lid walls on the corresponding container body walls. The snap-shut retaining connection between the lid and the body is simply disengaged to allow, thanks to the elastic return action of the spring or rear fold connecting the lid to the body, natural opening without the side walls 32 and 34 of the lid interfering with the corresponding container body walls. In this case, although the retaining means which hold the lid snapped shut on the body are disengaged, there is no risk of the lid remaining incorrectly closed then opening inopportunely.

The special shape of the container body gives the snap-shut retaining tab on the front wall optimum elasticity, so that, when the tab engages with the teeth on the lid, there is a clear, characteristic noise or "click", which confirms that the snap-shut retaining means are closed or engaged.

Moreover, a pack is obtained which can be made without using an excessive amount of material.

According to the various embodiments of the present pack, a stiffener is used which advantageously consists of a single panel connecting corresponding side walls of the container body.

With the various versions of the stiffening means extending perpendicularly to the X axis of the container lying in the plane in which the tabs or retaining teeth on the container body substantially extend, which—as illustrated—extend from the upper edge 1839 of the outer wall 18, it is possible to obtain a desired "stiffening" of the wall of the container body on which the retaining tab is located. In this way, the "stiffness" or "elasticity" of the connection between the tabs on the container body and the teeth on the lid can be "regulated" as required.

The preferred material for production of the containers disclosed is cardboard, with suitable thickness and mechanical characteristics. However, any other suitable material, in particular which can be bent and folded as required but is sufficiently stiff, may be used.

The invention described is suitable for evident industrial applications and may be subject to modifications and variations without thereby departing from the inventive concept. Moreover, all of the details of the invention may be substituted by technically equivalent elements.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A container for holding a product, the container comprising:
a retaining body and side product retaining means and at least one outlet opening through which the product comes out, the container body having a tubular shape with a polygonal base, a front wall, a rear wall and at least one of a pair of front side walls and a pair of rear side walls, the container body further comprising a lid for closing the product outlet opening, the lid extending from the container body and being connected to the container body, the lid comprising a first and a second side outer wall, the container body further comprising stiffening means for maintaining the container body in an open condition, the stiffening means located at the product outlet opening, the stiffening means being connected to and extending from at least one of the front side walls or the rear side walls of the container body;
a first tooth and a second tooth, the first tooth extending from the first side outer wall of the lid, and the second tooth extending from the second side outer wall of the lid; and
a third tooth extending downward from an upper edge of the front wall of the container body to engage the first and second teeth to hold the lid closed.

2. The container according to claim 1, wherein the container body has a polygonal base.

3. The container according to claim 1, wherein the container body has a hexagonal base.

4. The container according to claim 1, wherein the container body has a polygonal base with regular sides.

5. The container according to claim 1, wherein at least one outer wall forms an obtuse angle with an adjacent outer wall.

6. The container according to claim 1, comprising a base wall for retaining the product in the container.

7. The container according to claim 1, wherein the lid is flat.

8. The container according to claim 1, wherein the lid extends from the rear wall of the container body.

9. The container according to claim 1, wherein the lid comprises a front wall under which the first and second teeth are positioned, and the first tooth and the second tooth have upper edges that engage a lower end of the third tooth.

10. The container according to claim 9, comprising retaining means for holding the lid closed, the retaining means comprising the first and second teeth and further comprising a tab extending downward from the front wall.

11. The container according to claim 10, wherein the front wall of the container body comprises a horizontal slot into which tab inserts.

12. The container according to claim 11, wherein the front wall of the container body comprises a vertical slot extending from the horizontal slot.

13. The container according to claim 10, wherein the retaining means on the lid operate in conjunction with engagement means on the container body.

14. The container according to claim 13, wherein the engagement means on the container body comprise the third tooth and a horizontal slot into which the tab inserts.

15. The container according to claim 1, wherein the side outer walls of the lid are front side walls.

16. The container according to claim 1, wherein the front wall of the container forms an obtuse angle with an adjacent front side wall.

17. The container according to claim 1, comprising connecting means between a rear wall of the lid and the container body.

18. The container according to claim 17, wherein the connecting means comprise a line for connection and rotation relative to a corresponding container body outer wall.

19. The container according to claim 1, wherein the first tooth is connected to the first side outer wall by a first fold or pre-creasing line, and the second tooth is connected to the second side outer wall by a second fold or pre-creasing line.

20. The container according to claim 1, wherein the third tooth is connected to the front wall of the container by a fold or pre-creasing line.

21. The container according to claim 1, wherein the first tooth extends toward the second tooth, the second tooth extends toward the first tooth, and the first tooth and the second tooth have upper edges that engage a lower end of the third tooth.

22. The container according to claim 1, wherein the first and second teeth are on an inner face of a front wall of the lid.

23. The container according to claim 1, wherein the stiffening means are located at one end of the container body.

24. The container according to claim 1, wherein the stiffening means comprise at least one portion extending transversally to the container body.

25. The container according to claim 1, comprising a single transversal panel extending from one end of an outer wall and forming the stiffening means.

26. The container according to claim 25, wherein the stiffening panel extends from a front outer wall.

27. The container according to claim 25, wherein the stiffening panel extends from a rear outer wall of the container body.

28. The container according to claim 25, wherein the transversal panel comprises a notch in an edge of the transversal panel.

29. The container according to claim 28, wherein the edge of the transversal panel containing the notch is the edge by which the transversal panel is connected to the container.

30. The container according to claim 29, wherein the edge connects the transversal panel to the front wall of the container body.

31. The container according to claim 29, wherein the edge connects the transversal panel to the rear wall.

32. The container according to claim 29, wherein the notch has linear sides rounded at ends opposite to the edge by which the transversal panel is connected to the container.

33. The container according to claim 28, wherein the notch has a predetermined size.

34. The container according to claim 33, wherein the notch is suitable for allowing a passage of a predetermined number of pieces of product at a time.

35. The container according to claim 28, wherein the notch has a predetermined shape and dimensions suitable for the passage of only one piece of product held in the container at a time.

36. The container according to claim 28, wherein the notch extends from a front side of the container body.

37. The container according to claim 1, the stiffening means comprising a transversal wall for stiffening and/or covering fixed to the front wall of the container body at two container points or opposite side sections of the container body.

38. The container according to claim 1, the stiffening means covering the outlet opening of the container body where the lid does not have side walls.

39. The container according to claim 1, wherein the container body has a wall supporting a lid engagement means comprising the third tooth, and the wall supporting the lid engagement means is connected at to at least one side wall, forming an angle other than 90° with said wall.

40. A blank for making a container consisting of a container body with an outlet opening through which the product contained in it comes out and a lid for closing the product outlet opening, the blank comprising:
a flat sheet comprising a plurality of side panels forming outer walls of the container body, separated from one another by transversal pre-creasing or fold lines, the blank also comprising an upper panel extending from a transversal end of a side panel to form a lid upper wall and a transverse stiffening wall extending from a transversal end of another side panel, the upper panel forming the lid upper wall including a polygonal profile having a first and a second outer edge on a side opposite that from which the upper panel forming the lid upper wall extends, a first and a second outer panel forming lid side walls, the side walls extending from the first and second outer edges, on the side opposite the one on which the upper panel is connected to the transversal end of the side panel of the container body, a first tooth extending from the first outer panel, a second tooth extending from the second outer panel, and a third tooth extending from one of the side panels that form the outer walls of the container body, the third tooth configured to engage the first and second teeth to hold the lid closed, the blank further comprising tabs extending, through pre-ceasing or fold lines, from rear and front side walls of the container, forming members for connecting the transverse stiffening wall to the front side walls and to the rear side walls of the container body.

41. The blank according to claim 40, wherein the upper panel forming the lid upper wall has a hexagonal profile.

42. The blank according to claim 41, wherein the upper panel forming the lid upper wall has a hexagonal profile with regular sides.

43. The blank according to claim 40, comprising another side panel, which is glued to a rear panel and which is used to join the rear panel to the side panel of the container body.

44. The blank according to claim 40, wherein the stiffening wall extends from a transversal end of an outer wall of the container body.

45. The blank according to claim 44, wherein the stiffening wall has a shaped edge.

46. The blank according to claim 40, comprising a panel forming a side or front longitudinal wall of the lid, extending from the panel forming the lid upper wall, through a pre-creasing or fold line on the side opposite that from which the panel extends from an outer panel of the container body.

47. The blank according to claim 40, wherein the first tooth and the second tooth are connected to the first outer panel and the second outer panel are by fold or pre-creasing lines, respectively, and the lid side walls formed by the first and second outer panels are outer walls of the lid.

* * * * *